United States Patent [19]

Schulz-Methke

[11] 3,962,563

[45] June 8, 1976

[54] DEVICE FOR THE INCREMENTAL SCANNING OF A LINE SCALE

[75] Inventor: Hans-Dieter Schulz-Methke, Breitscheid, Germany

[73] Assignee: Espera-Werke GmbH, Duisburg, Germany

[22] Filed: Sept. 9, 1974

[21] Appl. No.: 504,075

[30] Foreign Application Priority Data

Sept. 13, 1973 Germany.......................... 2346091

[52] U.S. Cl. .......................... 235/92 V; 235/92 MP; 235/92 WT; 235/92 EC; 235/92 R; 250/209
[51] Int. Cl.² ......................................... H03K 21/34
[58] Field of Search ........ 235/92 V, 92 MP, 92 DN, 235/92 EV, 92 EC, 92 WT; 250/209

[56] References Cited
UNITED STATES PATENTS

| | | |
|---|---|---|
| 3,371,335 | 2/1968 | Seewald.............................. 235/92 V |
| 3,403,392 | 9/1968 | Wogatzke ...................... 235/92 MP |
| 3,588,462 | 6/1971 | Kreckel et al. ..................... 235/92 V |
| 3,638,186 | 1/1972 | Schwefel............................ 235/92 V |
| 3,793,508 | 2/1974 | Maggi................................ 235/92 V |
| 3,811,648 | 5/1974 | Ream, Jr., et al. ................ 235/92 V |

Primary Examiner—Gareth D. Shaw
Assistant Examiner—John P. Vandenburg
Attorney, Agent, or Firm—Robert D. Yeager; Howard G. Massung

[57] ABSTRACT

A line scale scanner utilizing three photoelectric cells, offset relative to one another within a space no larger than one divisional unit of the scale, to be operated as the scale moves to divide each scale unit into six increments. Each of the six increments can be obtained as the line scale moves forward or backward, providing 12 combinations from which a discriminator forms electric pulses. The pulses indicate if the increment is odd or even and if it occurred as the line scale moved forward or backward. The odd and even pulses which are provided on two different outputs of the discriminator can then be fed to counters which analyze them to determine if a system malfunction has occurred. The counters can be connected to provide the same output when the system is operating without error. Likewise, the counters can be connected to count complementary when no error has occurred. A circuit is also disclosed which provides a defect signal when a malfunction of the system occurs.

12 Claims, 6 Drawing Figures

DEVICE FOR THE INCREMENTAL SCANNING OF A LINE SCALE

BACKGROUND OF THE INVENTION

1. Field of the Invention

The invention relates to a device for the incremental scanning of a line scale by means of a number of photocells aligned on the line scale in a pattern offset relative to one another, the output of the photocells being feedable to a counter as electrical impulses.

2. Description of the Prior Art

Devices for carrying out incremental measuring methods for determining the change of position of movable parts are used for positioning tools on machine operators, but more particularly in inclination balances, in which the change in position of a line scale is directly proportional to the weight resting thereon. By the incremental measurement of the position of the line scale a number of impulses are received which are directly proportional to the weight of the goods and which, by means of impulse counters and recording units connected thereto make it possible to numerically record the value of the weight; alternatively, the impulses may be conducted to electronic computers in order to have the measured values processed thereby, so that the price of the goods may be figured out with the aid thereof.

Because of the substantial economic value of such measurements for determining output in commercial transactions it must be demanded that care be exercised so that the results of the measurements are not adulterated by systematic errors which might arise from the breakdown of one of the electronic structural elements used in constructing the measuring equipment.

Various measures have already been made known for protection against errors which arise from the partial or total breakdown of a structural component. For scanning the line scale German Pat. Application No. 2,161,634 uses two photocells which are illuminated by a lamp through a line scale and by optical auxiliary means, and which are so adjusted relative to one another that when the line scale moves, attached triggers of small switching point hysteresis deliver impulses in such a way that every impulse that is delivered by one of the two triggers of the first photocell is followed temporally by an impulse from one of the two triggers of the second photocell, and if this condition is not met, a defect signal is given.

German Pat. Application No. 2,020,393 tells of another method for controlling defects. In this patent two directionally identified photocells which are adjusted in a special way relative to one another produce counting impulses and the circuit angle and/or the amplitude is checked which, when the scanning signals delivered by the photocells deviate from the required values of the phase position and/or the amplitude, triggers a defect signal.

It is a drawback in both instances that the photoelectric cells must undergo precise adjustment and that, moreover, in the course of carrying out the controlling, changes in the brightness of the lamp or insignificant soiling resulting from the comparison of "required" with "actual" already lead to defect signals. Furthermore, in the second instance the control circuit is a circuit which is separate from the actual discriminator and its breakdown is not monitored.

There is another method wherein at a defined point in the moving scale a third photocell emits an impulse which designates the count as being incorrect if at that very moment it does not coincide with the ones associated with the point in question. The drawback of this arrangement lies in the fact that there is only one point of control in the entire range of movement of the scale, all the other points remaining uncontrolled.

SUMMARY OF THE INVENTION

According to the invention, the device is characterized by the fact that each of three photoelectric cells is disposed offset from the other at a distance of approximately one third of the divisional interval of the line scale and that the three photoelectric cells are connected to a discriminator circuit by which the changes resulting from the change in lighting of the photoelectric cells when the line scale is moved are transformed into electrical impulses in such a way that a connected forward-backward counter will count the number of scanning steps as a function of their direction.

In a further development of the invention, for the purpose of identifying defective functions the discriminator circuit may be so selected that when the scanning and discriminator circuits are operating flawlessly, the counting impulses appear alternately at two different outputs of the discriminator circuit, but when there are flaws or errors in operation, at least two impulses appear at the same output without an alternative impulse appearing therebetween.

Furthermore, according to the invention provisions may be made to have two forward-backward counters connected to the counting outputs of the discriminator, of the counters being connected to the discriminator directly and the other by way of a selector circuit. The selector circuit blocks the counting impulse, which appears as a second impulse at the same output of the discriminator, without having been preceded by an impulse at the other output.

By connecting two forward-backward counters in this manner it is possible to obtain identical counting results when operation of the discriminator and scanning circuit are flawless, but in the case of a defect different counting results will be obtained. For other applications of the counting results, it may be advantageous if the two connected counters count complementarily to one another, and in the case of no errors their counting results are complementary to one another.

In another embodiment of the invention, provision may be made for connecting a control circuit to the outputs of the discriminator; this circuit will give off a defect signal if two impulses are delivered successively from one output of the discriminator without an impulse having been delivered from the other output in the interim.

It is an object of this invention to disclose a device of the type mentioned in the introduction which with a simple construction may be readily adjusted and which is distinguished by a high power of analysis making it possible to obtain a great number of scanning stages with a relatively crude line division and which in addition thereto offers the prerequisite of obtaining a scanning of the line scale that makes functional defects identifiable.

BRIEF DESCRIPTION OF THE DRAWINGS

For a better understanding of the invention, reference may be had to the preferred embodiments exemplary of the invention shown in the accompanying drawings, in which.

DESCRIPTION OF THE PREFERRED EMBODIMENTS

Figure 1:
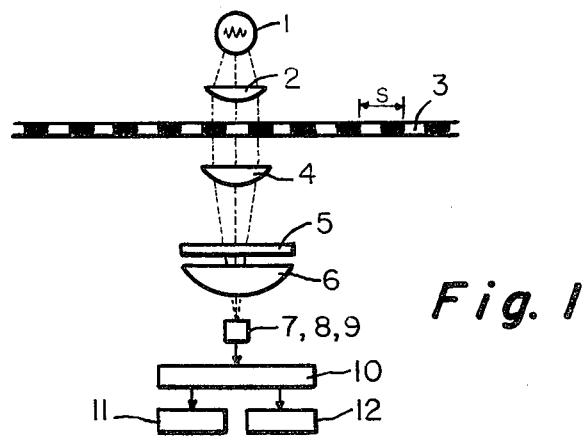
FIG. 1 is a top view of a scanning device utilizing the teaching of the present invention.

Referring now to the drawings and FIG. 1 in particular, there is shown apparatus utilizing the teaching of the present invention. In FIG. 1 lamp 1 by way of lens 2 illuminates the line scale which is divided into sectional divisions s by way of objective lens 4. The light that passes through diaphragm 5 is thrown by way of directing lens 6 onto three photoelectric cells 7, 8 and 9 that are arranged one above the other and are connected to discriminator circuit 10. Discriminator 10 delivers the impulses for the two forward-backward counters 11 and 12.

Figure 2:
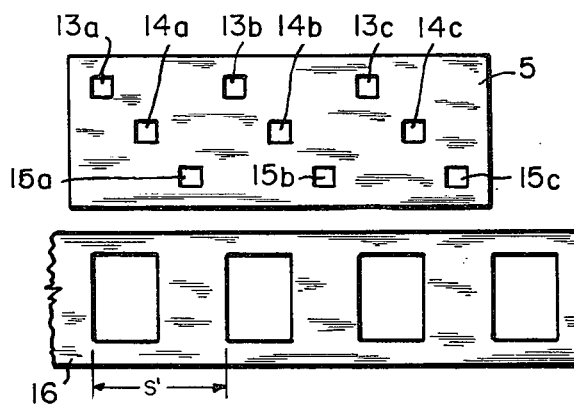
FIG. 2 is a front view of the diaphragm.

Diaphragm 5 is shown in detail in FIG. 2. It contains three rows of light permeable apertures 13a–c, 14a–c, and 15a–c. The light permeable apertures of each row are offset relative to the next row by approximately one third of $s'$, $s'$ being the divisional interval of the projected scale 3 in the plane of diaphragm 5. In FIG. 2, the image of the projected scale in the plane of diaphragm 5 is designated by reference numeral 16.

When scale 3 is moved, light or no light passes alternately through the light permeable apertures of diaphragm 5. The brightness conditions behind diaphragm 5 are shown graphically in FIG. 3 by curves 17a, 18a and 19a as a function of the movement of scale 3.

Behind diaphragm 5 are the three photoelectric cells 7, 8, and 9 which are illuminated by the light passing through diaphragm 5 in such a way that photoelectric cell 7 will receive the light passing through apertures 13a–c, photoelectric cell 8 will receive the light passing through apertures 14a–c, and photoelectric cell 9 will receive the light passing through apertures 15a–c.

Figure 3:
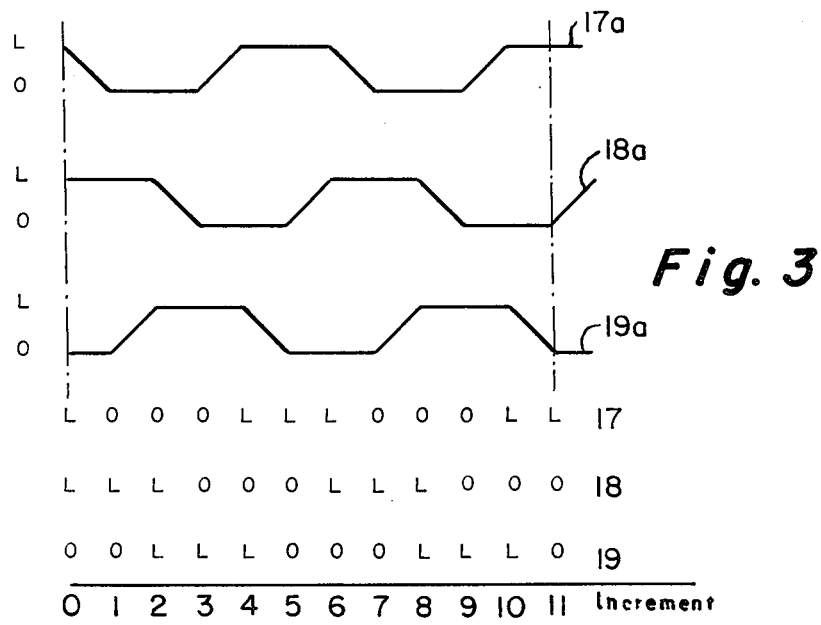
FIG. 3 is a representation of the light pattern on the photoelectric cells.

The photoelectric cells transform the light falling upon them into equivalent electrical states or conditions which in the illuminated case are designated by reference L, and in the unilluminated case by reference O. The outputs of the photoelectric cells will behave in synchronism with the changes in brightness behind diaphragm 5, as scale 3 is moved. This relationship is shown in FIG. 3 in the form of the three-line Table, line 17 representing the output of photoelectric cell 7, line 18 that of photoelectric cell 8, and line 19 that of photoelectric cell 9.

The movement of the scale by one divisional interval, s, is resolved into six increments. As may be seen, the photoelectric cells 7, 8, and 9 output conditions are repeated after every six increments when scale 3 is moved in one direction.

Figure 4:
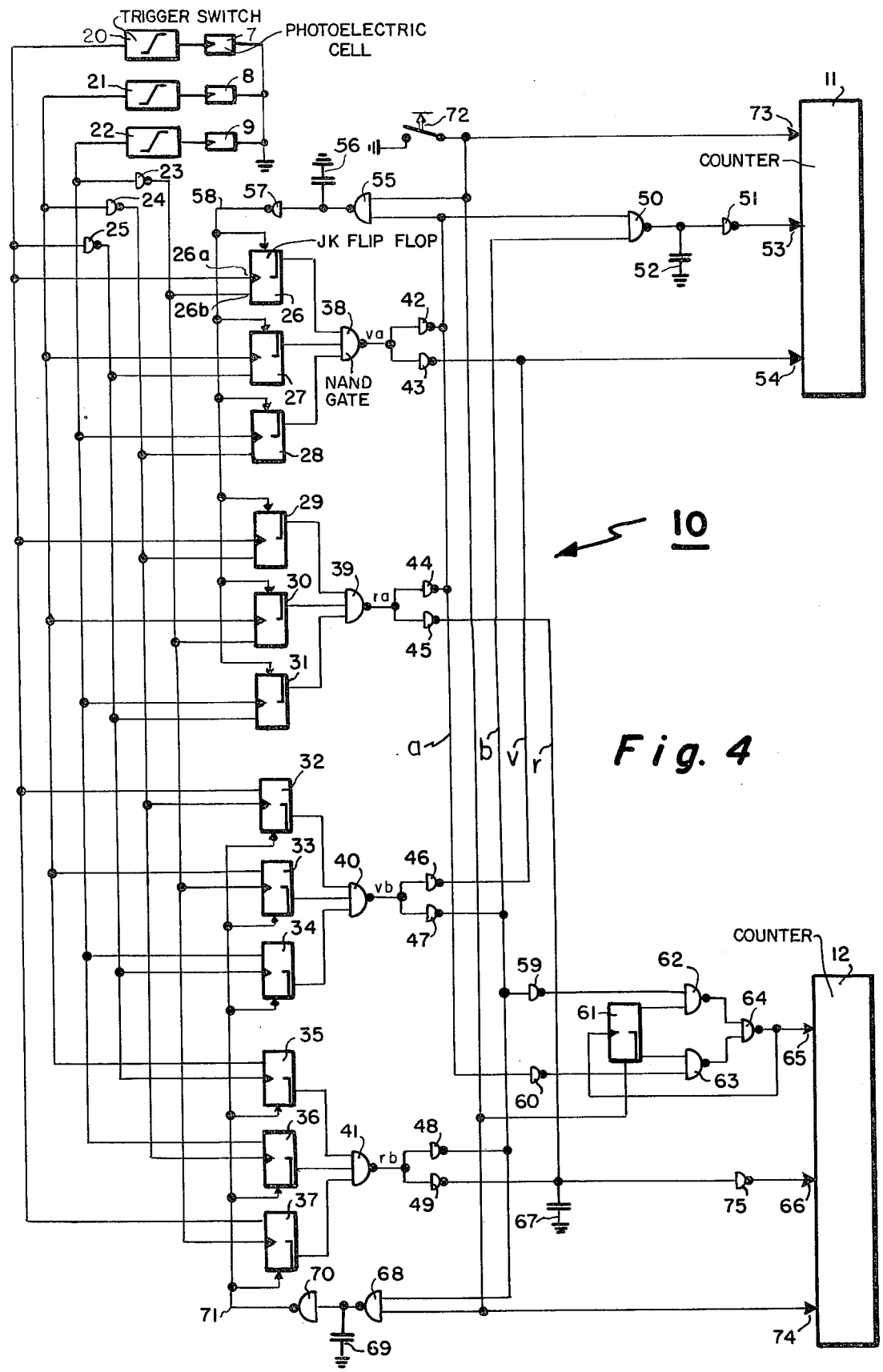
FIG. 4 illustrates the discriminator circuit.

It is the purpose of the discriminator, shown in FIG. 1 as a block 10 and in FIG. 4 in a detailed manner, to derive electrical impulses and directional signals from the conditions at the output of photoelectric cells 7, 8, and 9 so that with direction-controlled counting in forward-backward counters 11 and 12 the contents of the counter will be equal to the number of increments by which the scale has been moved out of a zero position.

To accomplish this the three photoelectric cells 7, 8, and 9 feed three triggers 20, 21, and 22 that serve to form the impulse both with preparatory inputs and with timing inputs to the JK flip-flops 26–37, directly on the one hand, and by way of the negations through inverters 23, 24, and 25 on the other. In the discriminator circuit of FIG. 4, for example, the timing input is designated by reference numeral 26a, and the preparatory input is designated by reference numeral 26b for flip-flop 26.

The disclosed scanner is constructed in such a way that each possible step from increment to increment in the position of lines 17, 18, and 19, either forward or backward, makes a total of twelve possible combinations, and each combination switches one of the twelve flip-flops 26-37 over. That is, each scale divisional interval, s, is resolved into six increments, and each increment can be approached in a forward or backward direction, making twelve combinations, each of which activates one of the flip-flops 26-37. Thus, for example, the step from 0 to 1:

| | | |
|---|---|---|
| 17 | L | O |
| 18 | L | L |
| 19 | O | O |
| Step | 0 | 1 | switches flip-flop 26 over.

The outputs of flip-flops 26-37 are combined into four groups by NAND gates 38-41 whose outputs are designated by references va, ra, vb, and rb.

There are two criteria for this combination: the criterion of the direction of movement, and the criterion of the increment that has been reached. Belonging to the group of the output designated by reference va in FIG. 3 are all the flip-flops 26–28 which switch over when an odd-numbered increment in the direction of a larger numeral is reached. Belonging to the group of the output designated by reference vb are all the flip-flops 32–34 which switch over when an even-numbered increment in the direction of a larger numeral is reached; belonging to the group of the output designated by reference ra are all the flip-flops 29–31 which switch over when an odd-numbered increment in the direction of a smaller numeral is reached; and belonging to the group of the output designated by reference rb are all the flip-flops 35–37 which switch over when an even-numbered increment in the direction of a smaller numeral is reached.

If, for example, the scale is moved by seven steps in the direction of a larger number of increments, and then back again, we get Table 1 for the flip-flops 26–37 and outputs va', vb, ra, and rb that are affected step by step.

TABLE I

| Increment | Scanning | Flip-flop | Output | Impulses |
|---|---|---|---|---|
| 0 | L L O | — | — | — |
| 1 | O L O | 26 | va | v' a' |
| 2 | O L L | 33 | vb | v' b' |
| 3 | O O L | 27 | va | v' a' |
| 4 | L O L | 34 | vb | v' b' |
| 5 | L O O | 28 | va | v' a' |
| 6 | L L O | 32 | vb | v' b' |
| 7 | O L O | 26 | va | v' a' |
| 6 | L L O | 35 | rb | r' b' |
| 5 | L O O | 30 | ra | r' a' |
| 4 | L O L | 37 | rb | r' b' |
| 3 | O O L | 29 | ra | r' a' |

TABLE I-continued

| Increment | Scanning | Flip-flop | Output | Impulses |
|---|---|---|---|---|
| 2 | O L L | 36 | rb | r' b' |
| 1 | O L O | 31 | ra | r' a' |
| 0 | L L O | 35 | rb | r' b' |

Outputs *va*, *vb*, *ra*, and *rb* are again combined by NAND-gates 42–49 onto four lines *v*, *r*, *a*, and *b*.

Impulses are provided on line:
- *v:* when a step is executed in the direction of larger number of increments ("forward"),
- *r:* when a step is executed in the direction of a smaller number of increments ("backward"),
- *a:* when an odd-numbered increment has been reached,
- *b:* when an even-numbered increment has been reached.

The switching over of one of the gates 42 or 44, first of all, has the consequence that a signal from line a by way of NAND gate 55, through inverter 57 which is connected to capacitor 56, for the purpose of time delay, is fed back, and the corresponding flip-flop 26–31 is switched back by way of line 58. This also causes line a to return to its initial state. Through a step to an odd-numbered increment an impulse is created on line a, the breadth of the impulse being dimensioned by the size of capacitor 56.

Similarly the switching over of one of the gates 47 or 48 causes the associated flip-flop 32–37 to be reset by way of gate 68, inverter 70 and capacitor 69 by way of line 71. On line *b*, when an even-numbered increment has been reached, an impulse is created whose breadth is dimensioned by the size of capacitor 69.

At the same time an impulse occurs on either line *v* or *r*, depending upon whether the step in question was executed in the direction of a larger or smaller number of increments. If the impulses are accordingly designated with references *a'*, *b'*, *v'*, and *r'*, then when the scale is moved, they will occur as shown in the last column of Table 1.

In carrying out the controlling of the flawless scanning it is important that impulses *a'* and *b'* always occur alternately, even after a change of direction. If, on the other hand, errors or defects occur in the scanning or switching over of flip-flops 26–37 or in gates 38–41, 42, 44, 46, 48, 55, 57, 68, or 70, then either impulse *a'* or impulse *b'* will occur two consecutive times without the other one occurring therebetween.

Three instances of an error or defect shall serve as When an increment is skipped:

| Increment | Scanning | Flip-flop | Imp. |
|---|---|---|---|
| 0 | L L O | — | — |
| 1 | O L O | 26 | a' |
| 3 | O O L | 27 | a' |

When a photoelectric cell is defective, and constantly in condition O:

| Increment | Scanning | Flip-flop | Imp. |
|---|---|---|---|
| 0 | L L O | — | — |
| 1 | O L O | 26 | a' |
| 2 | O L O | — | — |
| 3 | O O O | 27/30 | a' |

When the resetting of flip-flop 26 is defective:

| Increment | Scanning | Flip-flop | Imp. |
|---|---|---|---|
| 0 | L L O | — | — |
| 1 | O L O | 26 | a' |
| 2 | O L L | 33 | b' |
| 3 | O O L | 27 | — |
| 4 | L O L | 34 | b' |

The alternating sequence of *a'* and *b'* is interrupted, at the latest as soon as another increment follows the previous defect caused by not resetting flip-flop 26.

The further development of the circuit as shown in FIG. 4 is aimed at operating the two forward/backward impulse counters 11 and 12 in such a way that when the operation is flawless and *a'* and *b'* consecutively follow one another alternately, the counters 11, 12 will receive the same number of counting impulses. When there is an error and thus interruption in the alternating sequence, the counters 11, 12 will receive a different number of counting impulses.

In this connection counter 11 receives all *a'* (odd) and *b'* (even) impulses, even when they do not arrive alternately, but counter 12 receives impulses *a'* and *b'* only when they arrive alternately.

Figure 5:
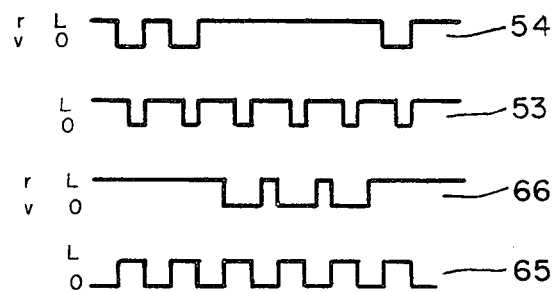
FIG. 5 is an impulse diagram.

For counting input 53, of counter 11, the impulses *a'* and *b'* are combined by NAND gate 50 and negated by inverter 51, with which an impulse delaying capacitor 52, feed counting input 53. Directional input 54 is governed by the signals from gates 43 and 46. Counter 11 counts forward when one of the two gates 43 and 46 delivers an impulse *v'*, and counts backward when no impulse occurs here. Capacitor 52, which provides a time delay, ensures that the side of counting impulse *a'* which triggers the counting process will fall into the time of the *v'*-impulse in order to reliably obtain a forward count by counter 11 when there are scanning steps in the direction of larger numbers. The impulse diagram is shown in FIG. 5.

In contrast to this, selector logic consisting of inverters 59 and 60, flip-flop 61, and NAND gates 62–64 are connected in front of counting input 65 of counter 12. An impulse *a'* or *b'* will get to input 65 only when flip-flop 61 is in a certain position in which it either allows impulse *b'* to be conducted further to input 65 by way of gate 62, or allows impulse *a'* to be conducted further to input 65 by way of gate 63. When an impulse appears at input 65, flip-flop 61 is switched over and thereby frees either gate 62 or 63 for transmitting another impulse *b'* or *a'*. If impulses *a'* and *b'* follow one another alternately, then the subsequent impulse will always find flip-flop 61 set so that the gates 62 or 63 permit the impulse to reach counting input 65.

However, if two impulses *a'* or *b'* occur without the other one intervening therebetween, then as the second impulse arrives, flip-flop 61 is switched over, so that the gate 62, 63 in question is blocking. Thereby counter 12 receives one impulse less than does counter 11, and a difference exists between the two counters.

Direction input 66 is governed by impulses *r'* which reach direction input 66 retarded by capacitor 67 and inverted by gate 75.

There is also a difference between counters 11 and 12 when, due to a defect in gates 43 and 46, on the one hand, or inverter 75, on the other hand, since if no directional impulse is given to a counter, the two counters no longer count in the same direction.

If desired for counters 11 and 12 to count complementary to one another, inverter 75 is omitted.

In a manner not shown here, the occurrence of a difference can be used to signal defects by means of devices which are connected at the outlet side for evaluating the contents of the count.

The common zero setting of all flip-flops 26–37 and 61 is brought about by closing key 72 with the aid of which counters 11 and 12 are also set at zero simultaneously by way of their zero positioning inputs 73 and 74.

Figure 6:
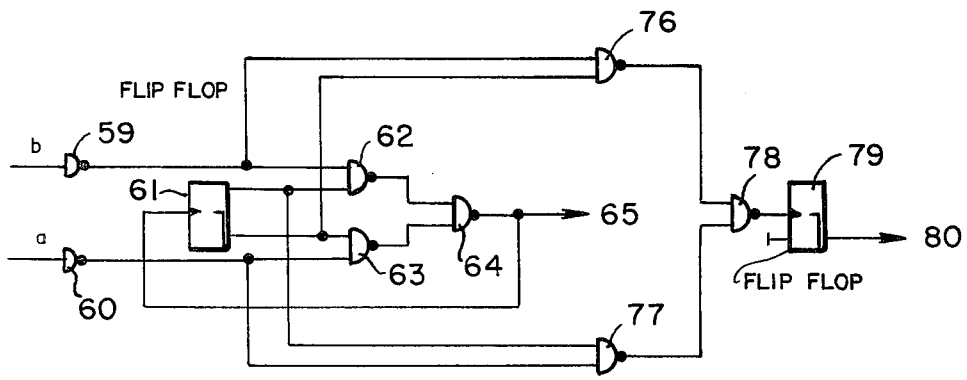
FIG. 6 is a defect signal indicating circuit which can be used with the discriminator circuit shown in FIG. 4.

If, on the other hand, it is desired that the discriminator itself should emit a defect signal, then the circuit should be enlarged by a circuit which is shown in FIG. 6. This circuit provides a signal indicating a defect if two impulses are delivered successively from one output. Impulses $a'$ and $b'$ are transmitted to two additional NAND-gates 76 and 77 which are connected to flip-flop 61 in crossed fashion. Then when two impulses $a'$ or $b'$ follow one another, an impulse will occur at the output of gate 78 which connects them, the impulse switches flip-flop 79 over, delivering a constant signal once the defective condition has occurred.

What is claimed is:

1. A device for incremental scanning of a line scale divided into divisional intervals comprising:
    three photoelectric cell means disposed at three different fixed points within a distance equivalent to one divisional interval of the line scale dividing each divisional interval into six increments;
    illumination control means for changing the illumination of said three photoelectric cell means as the line scale moves relative to said three photoelectric cell means;
    discriminator circuit means connected to said three photoelectric cell means for transforming into electric impulses the changes in resistance of said three photoelectric cell means caused by the change in the illumination of said three photoelectric cell means and having two outputs on which the electric impulses are provided; and,
    counter means connected to the outputs of said discriminator circuit means for forward and backward counting of the number of electric impulses as a function of the direction of line scale movement comprising two counters, one of which counts all impulses, the other of which counts only impulses preceded by an impulse on the opposite output.

2. A device as claimed in claim 1, wherein said discriminator circuit means comprises:
    a first output at which the even number of electrical impulses occur;
    a second output at which the odd number of electrical impulses occur; and,
    said discriminator means constructed so the electrical impulses occuring at said first output and said second output occur alternately when the device is functioning properly and at least two electrical impulses appear at one of said first output and said second output without an electrical impulse appearing at the other output in the interim, when there is defective functioning.

3. A device as claimed in claim 2, comprising:
    two forward-backward counters connected to the outputs of said discriminator circuit means;
    one of said counters being directly connected to said discriminator circuit means to count all output electrical impulses;
    the other of said counters connected to said discriminator circuit means by a selector circuit which blocks the electrical impulses which appear as a second impulse on the same output of the discriminator circuit means without having been preceded by an impulse on the other output.

4. A device as claimed in claim 2 comprising:
    a control circuit which emits a defect signal when two impulses are delivered consecutively from one output of the discriminator circuit means without an impulse having been delivered in the meantime from the other output.

5. A device as claimed in claim 2 wherein:
    said two forward-backward counters are connected to count complementary.

6. A device for the incremental scanning of a line scale divided into divisional intervals comprising:
    three photoelectric cells arranged in staggered relationship by one third of a divisional interval;
    discriminator means having said three photoelectric cells connected thereto for transforming into electrical counting and directional impulses the change of resistance caused by the change in illumination of said cells upon movement of the line scale relative thereto;
    two forward-backward counters connected to the output of said discriminator means for counting the electrical impulses in a direction controlled manner;
    said discriminator comprises two intermediate storage means, which are negation controlled relative to one another, and a pair of outputs;
    each of said intermediate storage means comprises a plurality of flip-flops and gates which are connected to emit counting impulses, when the device functions properly, alternately on said pair of outputs and in case of a functioning defect at least two impulses occur consecutively on one and the same output while, during this period of time, no impulse occurs on the other output;
    one of said forward-backward counters is connected to one of said outputs directly through a gate;
    the other of said forward-backward counters is connected to the other of said outputs through a selective circuit;
    said selective circuit comprises a flip-flop and a pair of gates which block a counting impulse which occurs as a second pulse on one of said discriminator means output without having been preceded by an impulse on the other output so that in case of proper functioning of the device, coinciding counting results occur on both counters, whereas in case a defective functioning, the results of both counters differ from one another.

7. A device as claimed in claim 6 comprising:
    a control circuit comprising a control flip-flop and a plurality of gates connected to the flip-flop of said selective circuit and said pair of discriminator outputs constructed to reverse said control flip-flop if one of said pair of outputs of said discriminator means emits two consecutive impulses during which time no impulse is emitted by the other output.

8. A device as claimed in claim 6 comprising:
    a pair of counters connected to said pair of outputs to count in a complementary way relative to one another.

9. A line scale scanner adapted for component malfunction detection comprising:

a plurality of photoelectric cells disposed within one divisional interval of the line scale;

a line scale, having an aperture within each divisional interval, movable with respect to said plurality of photoelectric cells;

illumination control means for changing the illumination of said plurality of photoelectric cells as said line scale moves dividing each divisional interval into a plurality of increments larger than the number of said plurality of photoelectric cells;

discriminator circuit means connected to said plurality of photoelectric cells for transforming into electric impulses the changes in resistance of said plurality of photoelectric cells caused by the change in illumination of said plurality of photoelectric cells as said line scale moves through an increment;

said discriminator means provides a first output of the even numbered pulses and a second output of the odd numbered pulses;

a first counter connected to said first output and said second output for counting all pulses; and, a second counter connected to said first output and said second output for only counting a pulse on either output when preceded by a pulse on the opposite output.

10. A line scale scanner as claimed in claim 9 wherein:

said first counter and said second counter are connected to count complementary to one another.

11. A line scale scanner as claimed in claim 9 comprising:

a selector circuit disposed between said discriminator circuit means and said second counter for blocking pulses which appear as a second pulse at the same output of the discriminator without having been preceded by a pulse at the other output.

12. A line scale scanner as claimed in claim 11 comprising:

control circuit means connected to the outputs of said discriminator circuit means for providing a defect signal if two pulses are delivered successively from one output of the discriminator without a pulse having been delivered from the other in the interim.

* * * * *

UNITED STATES PATENT AND TRADEMARK OFFICE
CERTIFICATE OF CORRECTION

PATENT NO. : 3,962,563
DATED : June 8, 1976
INVENTOR(S) : Hans-Dieter Schulz-Methke It is certified that error appears in the above-identified patent and that said Letters Patent are hereby corrected as shown below:

Column 2, line 33, insert --one-- after "discriminator,";

Column 3, line 23, insert --circuit-- after "Discriminator" (second occurrence);

Column 5, line 52, insert --examples:-- after "serve as";

Claim 6, line 51, insert --of-- after "case".

Signed and Sealed this

Seventh Day of September 1976

[SEAL]

Attest:

RUTH C. MASON
*Attesting Officer*

C. MARSHALL DANN
*Commissioner of Patents and Trademarks*